(12) United States Patent
Kondo et al.

(10) Patent No.: US 9,664,822 B2
(45) Date of Patent: May 30, 2017

(54) COVER GLASS FOR PHOTOELECTRIC CONVERSION DEVICE

(71) Applicant: Nippon Sheet Glass Company, Limited, Tokyo (JP)

(72) Inventors: Fumiyoshi Kondo, Hyogo (JP); Takeshi Yabuta, Hyogo (JP); Mitsuhiro Kawazu, Hyogo (JP)

(73) Assignee: NIPPON SHEET GLASS COMPANY, LIMITED, Tokyo (JP)

( * ) Notice: Subject to any disclaimer, the term of this patent is extended or adjusted under 35 U.S.C. 154(b) by 0 days.

(21) Appl. No.: 14/418,791

(22) PCT Filed: Jul. 9, 2013

(86) PCT No.: PCT/JP2013/004247
§ 371 (c)(1),
(2) Date: Jan. 30, 2015

(87) PCT Pub. No.: WO2014/020836
PCT Pub. Date: Feb. 6, 2014

(65) Prior Publication Data
US 2015/0177425 A1      Jun. 25, 2015

(30) Foreign Application Priority Data

Aug. 1, 2012 (JP) ................................. 2012-171266

(51) Int. Cl.
*G02B 1/113* (2015.01)
*G02B 5/02* (2006.01)
(Continued)

(52) U.S. Cl.
CPC ............ *G02B 5/0226* (2013.01); *G02B 1/113* (2013.01); *G02B 1/118* (2013.01); *G02B 5/0268* (2013.01);
(Continued)

(58) Field of Classification Search
CPC ........ G02B 5/0226; G02B 1/113; G02B 5/02; G02B 1/11; H01L 31/042; H02S 40/22;
(Continued)

(56) References Cited

U.S. PATENT DOCUMENTS

| | | | |
|---|---|---|---|
| 7,026,542 B2 | 4/2006 | Kageyama et al. |
| 2003/0005956 A1 | 1/2003 | Hirata et al. |
| 2012/0244318 A1 | 9/2012 | Koyo et al. |

FOREIGN PATENT DOCUMENTS

| | | |
|---|---|---|
| EP | 1 167 313 | 1/2002 |
| JP | 2001-278637 | 10/2001 |

(Continued)

OTHER PUBLICATIONS

Extended European Search Report issued in corresponding European Application No. 13825709.2, Feb. 2, 2016, 8 pages.

*Primary Examiner* — Laura Auer
(74) *Attorney, Agent, or Firm* — Hamre, Schumann, Mueller & Larson, P.C.

(57) ABSTRACT

A cover glass of the present invention for photoelectric conversion devices includes a glass sheet having surface asperities and a reflection-reducing film formed over the surface asperities of the glass sheet. The surface asperities of the glass sheet have an average spacing Sm of 0.3 mm or more and 2.5 mm or less and an arithmetic average roughness Ra of 0.3 μm to 5 μm. The reflection-reducing film includes fine silica particles having an average particle diameter of 50 to 200 nm and a binder for the fine silica particles, and the fine silica particles are uniformly arranged in a single layer on peak portions of the surface asperities in such a manner that a filling fraction F is 35 to 65%. A transmittance gain is 2.37% or more, the transmittance gain being obtained by subtracting an average transmittance of the glass sheet as measured when light having wavelengths ranging from 380 to 1100 nm are incident on a face of the (Continued)

glass sheet that has the surface asperities, from an average transmittance of the cover glass as measured when light having the wavelengths are incident on a reflection-reducing film side of the cover glass. Thus, a cover glass for photoelectric conversion devices that exhibits a high transmittance gain is provided.

6 Claims, 3 Drawing Sheets

(51) Int. Cl.
| | |
|---|---|
| *B32B 5/16* | (2006.01) |
| *H02S 40/22* | (2014.01) |
| *H01L 31/042* | (2014.01) |
| *G02B 1/118* | (2015.01) |
| *H02S 40/20* | (2014.01) |

(52) U.S. Cl.
CPC ......... *G02B 5/0278* (2013.01); *G02B 5/0294* (2013.01); *H01L 31/042* (2013.01); *H02S 40/20* (2014.12); *H02S 40/22* (2014.12); *Y02B 10/12* (2013.01); *Y02E 10/52* (2013.01); *Y10T 428/24421* (2015.01)

(58) Field of Classification Search
CPC .. Y10T 428/24421; Y02B 10/12; Y02E 10/50
See application file for complete search history.

(56) References Cited

FOREIGN PATENT DOCUMENTS

| | | |
|---|---|---|
| JP | 2003-243689 | 8/2003 |
| JP | 2009-088503 | 4/2009 |
| JP | 2010-087539 | 4/2010 |
| WO | 2011/070714 | 6/2011 | ed.

COVER GLASS FOR PHOTOELECTRIC CONVERSION DEVICE

TECHNICAL FIELD

The present invention relates to a cover glass for photoelectric conversion devices that is disposed on the light incident side of a photoelectric conversion device and that allows transmission of light to a photoelectric conversion layer in the photoelectric conversion device while protecting the device.

BACKGROUND ART

A cover glass is usually disposed on the light incident side of a so-called crystal type photoelectric conversion device. However, when the photoelectric conversion device is installed on the roof of a house, reflected light from the cover glass may cause annoyance to neighboring houses. Therefore, in the cases where attention should be paid to reflected light, such as when the photoelectric conversion device is installed on the roof of a house, a cover glass is used which has asperities formed in its surface to disperse reflected light.

The shape of surface asperities has influence on the amount of light transmitted through a cover glass. Thus, there have been reported attempts to optimize the shape of surface asperities of a cover glass in order to improve the photoelectric conversion efficiency. For example, Patent Literature 1 discloses a cover glass having semi-spherical recesses formed in its surface. The shape and arrangement of the recesses of this cover glass are designed to increase the amount of light transmitted through the cover glass during daytime over the course of a year. When recesses are formed for such purposes, the depth of the recesses is set deeper than when recesses are formed only for the purpose of anti-glare.

In order to increase the light transmittance of a transparent substrate typified by a glass sheet, a reflection-reducing film is formed on a surface of the substrate in some cases. A most frequently used reflection-reducing film is a dielectric film obtained by vacuum deposition, sputtering, chemical vapor deposition (CVD), or the like. A fine particle-containing film containing fine particles such as fine silica particles is also used as the reflection-reducing film in some cases. The fine particle-containing film is formed by applying a coating liquid containing the fine particles onto the transparent substrate by means of dipping, flow coating, spraying, or the like.

With a reflection-reducing film formed on that surface of a cover glass which has surface asperities, the appearance may be significantly deteriorated due to uneven reflection. In order to reduce the deterioration in appearance, for example, Patent Literature 2 discloses a cover glass for photoelectric conversion devices that includes a reflection-reducing film and in which the shape of surface asperities of a glass sheet and the number of layers of fine silica particles stacked in valley portions of the surface asperities and on peak portions of the surface asperities are adjusted. This cover glass has a reflectance of 1.5% or more and 3% or less over the entire wavelength range of 380 nm to 780 nm for light incident on a side on which the reflection-reducing film is formed; thus, the deterioration in appearance due to uneven reflection is reduced.

CITATION LIST

Patent Literature

Patent Literature 1: JP 2003-243689 A
Patent Literature 2: WO 2011/070714 A1

SUMMARY OF INVENTION

Technical Problem

In a cover glass for photoelectric conversion devices in which a reflection-reducing film containing fine silica particles is formed over surface asperities of a glass sheet, a transmittance gain obtained by subtracting an average transmittance of the glass sheet alone from an average transmittance of the cover glass for light incident on the reflection-reducing film side is an important factor for the performance of the cover glass for photoelectric conversion devices. The higher the transmittance gain of the cover glass is, the more the amount of light transmitted through the cover glass is, and the higher the efficiency of the photoelectric conversion device is. However, the cover glass described in Patent Literature 2 has room for improvement in transmittance gain.

In view of such circumstances, the present invention aims to increase the transmittance gain of a cover glass for photoelectric conversion devices in which a reflection-reducing film containing fine silica particles is formed over surface asperities of a glass sheet.

Solution to Problem

The present invention provides a cover glass for photoelectric conversion devices, the cover glass including:
a glass sheet having surface asperities; and
a reflection-reducing film formed over the surface asperities of the glass sheet.

The surface asperities of the glass sheet have an average spacing Sm of 0.3 mm or more and 2.5 mm or less and an arithmetic average roughness Ra of 0.3 μm to 5 μm,
the reflection-reducing film includes fine silica particles having an average particle diameter of 50 to 200 nm and a binder for the fine silica particles,
the fine silica particles are uniformly arranged in a single layer on peak portions of the surface asperities in such a manner that a filling fraction F is 35 to 65%,
a transmittance gain is 2.37% or more, the transmittance gain being obtained by subtracting an average transmittance of the glass sheet as measured when light having wavelengths ranging from 380 to 1100 nm are incident on a face of the glass sheet that has the surface asperities, from an average transmittance of the cover glass as measured when light having the wavelengths are incident on a reflection-reducing film side of the cover glass, and
the filling fraction F is defined by the following formula:

$$F = A/B \times 100, \text{ where}$$

A represents the number of the fine silica particles contained in a square region each of whose sides has a length that is 10 times the average particle diameter of the fine silica particles, and
B represents the number of spheres filled in the square region when the spheres are assumed to have a diameter equal to the average particle diameter of the fine silica particles and to be arranged in closest packing in the square region.

Advantageous Effects of Invention

In the cover glass of the present invention, the average particle diameter of the fine silica particles contained in the reflection-reducing film is 50 to 200 nm, and the fine silica particles are uniformly arranged on the peak portions of the surface asperities in such a manner that the filling fraction F is 35 to 65%. Thus, the fine silica particles are arranged on the peak portions of the surface asperities at an appropriate density; consequently, the cover glass of the present invention exhibits a high transmittance gain.

DESCRIPTION OF EMBODIMENTS

Figure 1:
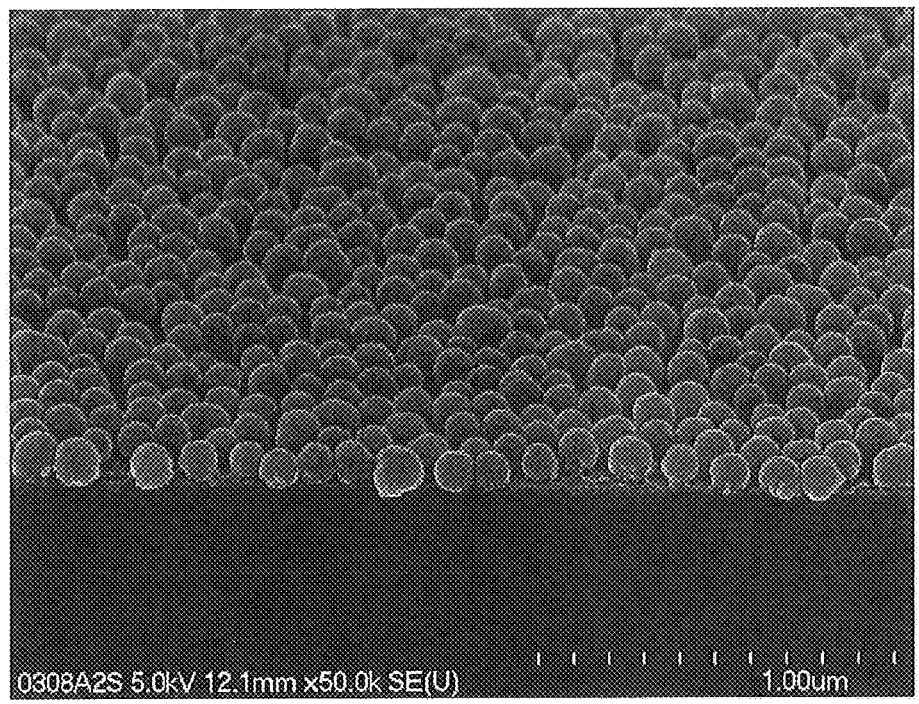
FIG. 1 shows a result of field emission scanning electron microscope (FE-SEM) observation of a peak portion of surface asperities of a cover glass according to Example 1.

Hereinafter, embodiments of the present invention will be described. It should be noted that the following description relates to examples of the present invention, and the present invention is not limited by these examples.

A cover glass for photoelectric conversion devices according to the present invention includes a glass sheet having surface asperities and a reflection-reducing film formed over the surface asperities of the glass sheet. The average spacing Sm of the surface asperities of the glass sheet is 0.3 mm or more and 2.5 mm or less. The average spacing Sm is preferably 0.3 mm or more, particularly preferably 0.4 mm or more, and more particularly preferably 0.45 mm or more. The average spacing Sm is preferably 2.5 mm or less, more preferably 2.1 mm or less, particularly preferably 2.0 mm, and more particularly preferably 1.5 mm or less. The average spacing Sm is particularly preferably 0.5 mm or more and 1.5 mm or less. The average spacing Sm means an average value of lengths of peak-valley periods in a roughness profile which are determined based on points at which the roughness profile intersects a mean line. Specifically, the average spacing Sm is a value specified in JIS (Japanese Industrial Standards) B 0601-1994. If the average spacing Sm is too small, the influence of the surface asperities on light having wavelengths in and around the visible region is averaged, and therefore the reflectance curve is not flattened sufficiently. On the other hand, if the average spacing Sm is too large, unevenness of reflected color in the surface appears, and therefore the requirements for appearance are not met.

Figured glass produced by a roll-out method is suitable as the glass sheet having an average spacing Sm within the above-specified range. The roll-out method is a glass sheet production method conventionally used for producing figured glass mainly used as window glass of buildings. In the roll-out method, a molten glass raw material is pressed between a pair of rolls and thus formed into a sheet; therefore, if the surface of the roll is provided with asperities, the shape of the asperities is transferred onto a surface of the glass sheet. The glass sheet having surface asperities can be obtained also by roughening a glass sheet having a flat surface by etching. However, the surface processing by etching results in a too small average spacing Sm; therefore, formation of the surface asperities by etching process is not suitable for production of the glass sheet of the present invention. The glass sheet may have a composition similar to that of common figured glass or architectural sheet glass, but preferably contains no, or the least possible amount of, coloring component. In the glass sheet, the content of iron oxide, which is a typical coloring component, is preferably 0.06 mass % or less, and particularly preferably 0.02 mass % or less, as calculated in terms of $Fe_2O_3$ content.

The surface asperities of the glass sheet preferably have a maximum height Ry of 0.5 µm to 10 µm, particularly 1 µm to 8 µm, as well as an average spacing Sm within the above-specified range.

In addition, the surface asperities of the glass sheet preferably have an arithmetic average roughness Ra of 0.3 µm to 5.0 µm, particularly 0.4 µm to 2.0 µm, more particularly 0.5 µm to 1.2 µm, as well as an average spacing Sm within the above-specified range. The maximum height Ry and the arithmetic average roughness Ra are specified in JIS B 0601-1994 together with the average spacing Sm. If the degree of roughness represented by these parameters is too low, sufficient anti-glare effect of the surface asperities cannot be obtained. On the other hand, if the degree of roughness represented by these parameters is too high, unevenness of reflected color in the surface may appear, or no film may be formed on the peak portions of the asperities which results in an increase in reflectance.

In the surface asperities of the glass sheet, an average slope angle θ represented by the formula $\theta = \tan^{-1}(4\,Ra/Sm)$ is preferably 0.05 to 1.0 degrees, and particularly preferably 0.1 to 0.5 degrees. The smaller the average slope angle θ is, the gentler the asperities of the glass surface are, and the less likely a satisfactory film thickness distribution is to be obtained when the film is formed, so that appearance defect may occur. The larger the average slope angle θ is, the steeper the asperities of the glass surface are, and the higher the probability that the glass sheet is exposed due to the film not being formed on the peak portions of the asperities, so that the reflectance tends to increase.

The reflection-reducing film contains fine silica particles, and these fine silica particles form the framework of the film. On the peak portions of the surface asperities of the glass sheet, the fine silica particles are arranged in a single layer (one layer) or, in other words, arranged without being stacked on each other. By contrast, in the valley portions of the surface asperities, the fine silica particles are stacked, for example, to a thickness corresponding to 1.5 to 2.1 times the average particle diameter of the fine silica particles. The thickness of the film formed of the fine silica particles can be determined by actually observing a cross-section of the reflection-reducing film using a scanning electron microscope (SEM) or the like. The variation in the thickness of the reflection-reducing film formed of the fine silica particles leads to flattening of the reflectance curve of the cover glass in the visible region. Therefore, the deterioration in appearance (color unevenness) due to uneven reflection can be reduced. The average particle diameter of the fine silica particles is, for example, 50 to 200 nm, preferably 75 to 150 nm, and more preferably 75 to 120 nm. The "average particle diameter" means a particle diameter corresponding to a cumulative volume of 50% (D50) in a particle size distribution measured by a particle size distribution measurement method using laser diffraction.

The fine silica particles having an average particle diameter within the above-specified range are arranged on the peak portions of the surface asperities uniformly and relatively sparsely. Specifically, the fine silica particles are uniformly arranged on the peak portions of the surface asperities in such a manner that a filling fraction F defined by the formula below is 35 to 65%.

$$F=A/B\times 100$$

A: The number of the fine silica particles contained in a square region each of whose sides has a length that is 10 times the average particle diameter of the fine silica particles.

B: The number of spheres filled in the square region when the spheres are assumed to have a diameter equal to the average particle diameter of the fine silica particles and to be arranged in closest packing in the square region.

The values of A and B are determined by counting only the number of the particles or spheres that are entirely contained in the square region without counting the number of the particles or spheres that are partly contained in the square region.

The phrase "uniformly arranged" means that the fine silica particles are arranged in such a manner that when the state of the arrangement of the fine silica particles of the reflection-reducing film on a peak portion of the surface asperities is observed with a SEM, there is not observed any region of the peak portion where the spacing between the fine silica particles (the distance between the centers of the adjacent fine silica particles) is extremely greater than that in the other regions of the peak portion. For example, the phrase "uniformly arranged" means that the fine silica particles are arranged in such a manner that the spacing between the fine silica particles falls within the range of 1.1 to 1.6 times the average particle diameter of the fine silica particles.

The filling fraction F represents the density or sparsity of the arrangement of the fine silica particles. If the filling fraction F is more than 65%, and the fine silica particles are too densely arranged on the peak portions of the surface asperities, it is difficult to increase the transmittance gain. If the filling fraction F is less than 35%, it is difficult to uniformly arrange the fine silica particles, and it is difficult to increase the transmittance gain. The filling fraction F is preferably 40 to 60%, and more preferably 45 to 55%. The transmittance gain is a value obtained by subtracting an average transmittance as measured when light having wavelengths ranging from 380 to 1100 nm are incident on the face of the glass sheet that has the surface asperities before the formation of the reflection-reducing film, from an average transmittance of the cover glass as measured when light having wavelengths ranging from 380 to 1100 nm are incident on the reflection-reducing film side of the cover glass.

Although hollow fine silica particles are commercially-available, the use of solid (non-hollow) fine silica particles is preferable because importance should be attached to abrasion resistance for a reflection-reducing film formed in a cover glass for photoelectric conversion devices.

The reflection-reducing film includes, in addition to the fine silica particles, a binder for the fine silica particles. The binder is present between the fine silica particles and the glass sheet and between the adjacent fine silica particles, and serves to increase the bonding strength between the fine silica particles and the glass sheet and between the adjacent fine silica particles. An oxide of a metal such as silicon, titanium, aluminum, zirconium, or tantalum is suitable as the binder, and silicon oxide (silica) is most suitable. Silicon oxide has high affinity for the fine silica particles and the glass sheet, and is thus excellent as a reinforcing agent. Also, silicon oxide has a low refractive index, and thus does not impair the reflection-reducing effect of the reflection-reducing film. Usually, silicon is not classified as a metal element; however, in this description, silicon oxide (compound) is considered a metal oxide (compound) as is conventionally done.

A hydrolyzable metal compound typified by silicon alkoxide can be used as a source of the binder. Examples of the silicon alkoxide include tetramethoxysilane, tetraethoxysilane, and tetraisopropoxysilane. The hydrolyzable metal compound may be hydrolyzed and condensation-polymerized into a binder by a so-called sol-gel process.

The hydrolysis of the hydrolyzable metal compound is preferably carried out in a solution in which the fine silica particles are present. This is because the condensation polymerization reaction between the silanol groups present on the surfaces of the fine silica particles and the silanol groups produced from hydrolysis of the metal compound such as silicon alkoxide is promoted, and the proportion of the binder contributing to enhancement of the bonding force of the fine silica particles is increased. Specifically, a coating liquid for forming the reflection-reducing film is preferably prepared by adding a hydrolysis catalyst and silicon alkoxide sequentially to a solution containing the fine silica particles while stirring the solution.

The ratio by weight of the fine silica particles to the binder in the reflection-reducing film is preferably 88:12 to 93:7, more preferably 89:11 to 92:8, and particularly preferably 89:11 to 91:9. The reflection-reducing film composed of the fine silica particles and the binder which are contained at a ratio within the above-specified range has appropriate voids provided in the framework formed of the fine silica particles, and thus can increase the transmittance gain of the cover glass. As a result of the voids being provided in the framework formed of the fine silica particles, the apparent refractive index of the film is reduced, and the reflection-reducing effect is increased, in addition to which the binder contributes to maintaining the strength of the framework formed of the fine silica particles. If the proportion of the binder is too high, the voids between the fine silica particles are lost. Conversely, if the proportion of the binder is too low, the strength of the framework formed of the fine silica particles is reduced.

Zirconium oxide (zirconia, $ZrO_2$), which is a metal oxide, is preferably added to the reflection-reducing film in addition to the fine silica particles and the binder. The content of zirconium oxide in the reflection-reducing film is preferably 3 to 6 weight %, more preferably 4 to 6 weight %, and particularly preferably 4.3 to 6.0 weight %. The addition of zirconium oxide increases the transmittance gain. It is not clear why the transmittance gain is increased when the content of zirconium oxide is in a specific range. The inventors think that the reason may be that the binder becomes denser by containing zirconium oxide, the porosity of the film is increased, and the apparent refractive index of the film is reduced. By the addition of zirconium oxide, the transmittance gain can be increased, for example, to 2.37% or more, even to 2.39% or more, and to 2.40% or more in some cases. Furthermore, the addition of zirconium oxide improves the alkali resistance of the reflection-reducing film. In a cover glass fabricated by forming the reflection-reducing film on figured glass, the absolute value of the difference between transmittances measured before and after the alkali resistance evaluation test described later is preferably 1.5% or less, and more preferably 1.0% or less. In order to improve the alkali resistance of the reflection-reducing film, the reflection-reducing film may contain titanium oxide (titania, $TiO_2$).

A dielectric multi-layer film formed by sputtering, CVD, or the like (e.g., a film formed by alternately stacking a high refractive index film made of titanium oxide or the like and a low refractive index film made of silicon oxide or the like) and a low refractive index film formed by vacuum deposition (e.g., a magnesium fluoride film formed by vacuum deposition) are also known as reflection-reducing films. However, it is very difficult to form such a reflection-reducing film to a small thickness on the peak portions of the surface asperities and to a large thickness in the valley portions of the surface asperities. By contrast, in the case of the fine particle-containing film, the film thickness distribution as described above can easily be achieved as shown in Examples described later.

The fine particle-containing film (reflection-reducing film) can be formed as follows: a coating liquid containing the fine silica particles and a compound serving as a source of the binder is fed to the surface of the glass sheet, followed by drying and then by heating. The feed of the coating liquid may be done, for example, by dipping the glass sheet in the coating liquid. However, a method of spraying the coating liquid onto the glass sheet is excellent in production efficiency, and is suitable for mass production.

Although the spraying is suitable for mass production in terms of production efficiency, the spraying has a problem in that when the spraying is applied to mass production, non-uniformity of the film thickness is likely to occur. This non-uniformity is due to the coating liquid emitted from a spray gun in the form of mist or due to overlap of the distribution of the mist (spray pattern), and emerges as an uneven reflected color portion having a diameter of about several millimeters.

The color unevenness caused by the spraying may be visually observed regardless of whether the surface of the glass sheet on which the reflection-reducing film is formed is smooth or has asperities. However, if the shape of the surface asperities meets the requirements described above, the color unevenness is accordingly eliminated.

The method of forming the reflection-reducing film over the surface asperities of the glass sheet by spraying will be described. First, a glass sheet having surface asperities whose shape meets the above-described requirements is prepared. A coating liquid containing fine silica particles and a metal compound serving as a source of a binder for the fine silica particles is sprayed onto the surface asperities of the glass sheet. The spraying of the coating liquid is carried out, for example, by applying the coating liquid from above to the horizontally held glass sheet using a spray gun whose distance from the glass sheet is kept constant.

Next, the glass sheet sprayed with the coating liquid is put and left, for example, in an electric furnace set at 400° C. for 46 seconds to dry the coating liquid to remove the solvent and the like contained in the coating liquid. Furthermore, the glass sheet is put and left, for example, in an electric furnace set at 610° C. for 8 minutes to yield an oxide from the metal compound contained in the coating liquid and thus to yield the binder for the fine silica particles.

A surfactant is added beforehand to the coating liquid. A silicon-based surfactant or a fluorine-based surfactant is suitable as the surfactant. The concentration of the surfactant in the coating liquid is preferably 0.005 weight % or more and 0.5 weight % or less, and particularly preferably 0.01 weight % or more and 0.3 weight % or less. It is thought that, as a result of the surfactant being added beforehand, the surface tension of the coating liquid is reduced, the aggregation of the fine particles is promoted as the liquid film is concentrated during the drying of the coating liquid fed to the surface of the glass sheet, the fine particles are deposited in the recessed portions of the glass sheet, and thus a preferable reflection-reducing film is formed.

EXAMPLES

Hereinafter, the present invention will be described in more detail with reference to examples. The present invention is not limited to the examples given below. First, methods of evaluating the properties of each of the cover glasses fabricated in the examples and comparative examples will be described.

(Surface Texture Measurement of Figured Glass)

The arithmetic average roughness Ra, the maximum height Ry, and the average spacing Sm of surface asperities of figured glass used as a substrate were determined by averaging values measured at ten measurement points using a non-contact three-dimensional texture measuring instrument (NH-3N, manufactured by Mitaka Kohki Co., Ltd.) according to JIS B 0601-1994 with the evaluation length set at 5.0 mm and the cut-off wavelength set at 2.5 mm. In addition, the average slope angle θ was determined using the arithmetic average roughness Ra and the average spacing Sm.

(Reflection Properties)

A reflectance curve (reflection spectrum) of the face on which the reflection-reducing film was formed was measured using a spectrophotometer (UV-3100, manufactured by Shimadzu Corporation). The measurement was performed, according to JIS K 5602, by making light incident on the face in a normal direction and introducing light directly reflected at an angle of 8° into an integrating sphere. The average reflectance was calculated by averaging reflectances at wavelengths ranging from 380 nm to 1100 nm. In addition, reflectance curves of the cover glass were measured before and after the formation of the reflection-reducing films. A value obtained by subtracting the average reflectance after the formation of the reflection-reducing film from the average reflectance before the formation of the reflection-reducing film was defined as a reflectance loss. In the measurement, black paint was applied to the back face (the face not subjected to the measurement) of the glass sheet to eliminate reflected light from the back face, and correction was made based on a standard specular reflector.

(Transmission Properties)

A transmittance curve (transmission spectrum) of the cover glass was measured using the above-mentioned spectrophotometer before and after the formation of the reflection-reducing film. The average transmittance was calculated by averaging transmittances at wavelengths ranging from 380 to 1100 nm. A value obtained by subtracting the average transmittance before the formation of the reflection-reducing film from the average transmittance after the formation of the reflection-reducing film was defined as a transmittance gain.

(Appearance Evaluation)

The appearance of the cover glass in which the reflection-reducing film was formed was visually evaluated based on the following criteria.

Excellent: A specific reflected color is evenly distributed.

Good: There is observed some variation in reflected color depending on the region of the cover glass, but the color evenness is good.

Insufficient: The reflected color differs depending on the region of the cover glass, and the color evenness is insufficient.

Poor: The difference in reflected color depending on the region of the cover glass is considerably large, and the color evenness is poor.

(SEM Observation)

The reflection-reducing film was observed with a field emission scanning electron microscope (FE-SEM) (S-4500, manufactured by Hitachi, Ltd.). The thickness of the reflection-reducing film at a recessed portion (valley portion) of the reflection-reducing film was measured based on a FE-SEM photograph, taken from above at an angle of 30°, of a cross-section of the recessed portion of the reflection-reducing film. Thicknesses of the reflection-reducing film at recessed portions (valley portions) of the glass sheet were determined for five measurement points based on the FE-SEM photograph, the determined values were averaged, and the average value was defined as the thickness of the reflection-reducing film. Furthermore, a square each of whose sides had a length that was 10 times the average particle diameter of the fine silica particles was placed on a FE-SEM photograph, taken from directly above, of a projecting portion (peak portion) of the reflection-reducing film, and the number of the fine silica particles entirely contained in the square was counted. If spheres having a diameter equal to the average particle diameter of the fine silica particles are arranged in closest packing within the square, the number of the spheres that can be contained in the square is 105. The ratio in percentage of the above-described counted number of the fine silica particles to the number of the spheres arranged in closest packing was defined as a filling fraction of the fine silica particles in projecting portions (peak portions) of the reflection-reducing film.

(Alkali Resistance Evaluation)

The alkali resistance of the obtained reflection-reducing film was evaluated by the following method. The cover glass having the formed reflection-reducing film was immersed in a saturated aqueous solution of calcium hydroxide having a temperature of 40° C. for 9 hours. The change in appearance before and after the immersion was visually observed, in addition to which transmittances were measured by a haze meter (NDH 2000 manufactured by NIPPON DENSHOKU INDUSTRIES CO., LTD.) before and after the immersion. The alkali resistance was evaluated based on the absolute value of the difference between the transmittances.

(Salt Spray Test)

A salt spray test was carried out to evaluate the salt water resistance of the obtained reflection-reducing film. An aqueous NaCl solution having a temperature of 35° C. and a concentration of 5 mass % was sprayed in the form of mist onto the cover glass having the formed reflection-reducing film for 96 hours. Transmittances were measured by a haze meter (NDH 2000 manufactured by NIPPON DENSHOKU INDUSTRIES CO., LTD.) before and after the spraying of the aqueous NaCl solution, and the salt water resistance was evaluated based on the absolute values of the transmittances.

Example 1

Preparation of Coating Liquid

An amount of 39.1 parts by weight of a fine silica particle dispersion liquid (PL-7, manufactured by FUSO CHEMICAL CO., LTD., average particle diameter=100 nm, solid content concentration=23 weight %), 56.4 parts by weight of ethyl cellosolve, and 1 part by weight of 1N hydrochloric acid (hydrolysis catalyst) were stirred and mixed. Under further stirring, 3.5 parts by weight of tetraethoxysilane was added to the mixture, which was then stirred for further 8 hours with its temperature maintained at 40° C. Thus, a raw material liquid was obtained. In this raw material liquid, the solid content concentration was 9 weight %, and the ratio by weight of the fine particles to the binder (in terms of oxide content) in the solid contents was 90:10. It should be noted that the fine silica particles were solid (i.e., non-hollow) fine particles.

A coating liquid was obtained by stirring and mixing 11 parts by weight of the raw material liquid, 10.0 parts by weight of 3-methoxy-1-butanol, 78.8 parts by weight of 2-propanol, 0.02 parts by weight of a silicon-based surfactant (L7001 manufactured by Dow Corning Toray Co., Ltd.), and 0.34 parts by weight of a 50% aqueous solution of zirconium oxychloride octahydrate (special grade, manufactured by KANTO CHEMICAL CO., INC.). In this coating liquid, the solid content concentration was 1.3 weight %, and the surfactant concentration was 0.02 weight %. In addition, the ratio by weight of $SiO_2$ to $ZrO_2$ was 100:4.7, as calculated in terms of oxide content.

<Formation of Reflection-Reducing Film>

Figured glass having a soda-lime-silicate composition (manufactured by Nippon Sheet Glass Co. Ltd., size=100 mm×300 mm, thickness=3.2 mm) was subjected to alkaline washing under ultrasonication, and thus was prepared as a substrate for formation of a reflection-reducing film. The surface texture of this figured glass was such that the surface asperities had an arithmetic average roughness Ra of 1.1 μm, a maximum height Ry of 4.8 μm, an average spacing Sm of 0.79 μm, and an average slope angle θ of 0.32°. The reflection properties and the transmission properties of this figured glass were measured by the above-described methods, and it was found that the average reflectance was 4.5% and the average transmittance was 91.6%.

Figure 2:
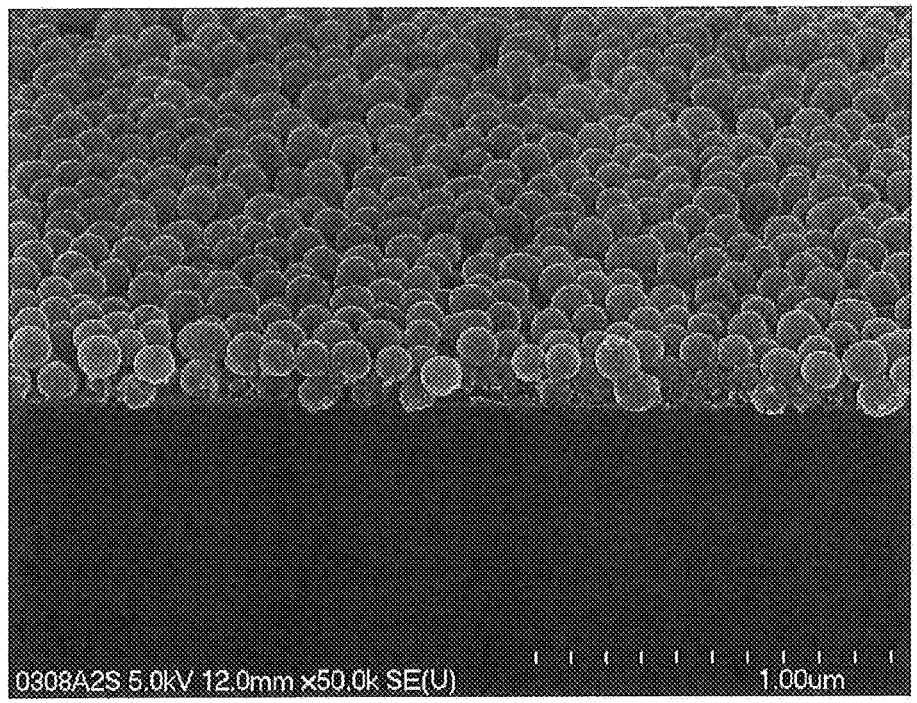
FIG. 2 shows a result of FE-SEM observation of a valley portion of the surface asperities of the cover glass according to Example 1.

The coating liquid was applied onto the figured glass by spraying. The spraying was performed using a commercially-available spray gun in such a manner that the coating liquid was sprayed from above onto the figured glass held horizontal. At this time, the spray gun and the figured glass were moved relative to each other while the distance between the spray gun and the figured glass was kept constant. Next, this figured glass was put and left in an electric furnace set at 400° C. for 46 seconds to remove the solvent of the coating liquid, and was then put and left in an electric furnace set at 610° C. for 8 minutes to fabricate a reflection-reducing film by calcining. Thus, a cover glass was obtained. The thus-obtained cover glass was evaluated for the above-described properties. The results of the evaluation are shown in Table 1. In addition, results of FE-SEM observation of cross-sections of the fabricated reflection-reducing film are shown in FIG. 1 (peak portion) and FIG. 2 (valley portion).

Example 2 to Example 8

Cover glasses according to Examples 2 to 8 were obtained in the same manner as in Example 1, except that the proportions of the materials for preparing the raw material liquid and the coating liquid, and the conditions for forming the reflection-reducing film (conditions for drying and conditions for calcining), were as shown in Table 2. In Example 3 and Example 4, as shown in Table 2, "CoatOSil 3505" manufactured by Momentive Performance Materials Japan LLC was used as the silicon-based surfactant. The thus-obtained cover glasses according to Examples 2 to 8 were evaluated for the above-described properties. The results of the evaluation are shown in Table 1.

Comparative Example 1 to Comparative Example 8

Figure 3:
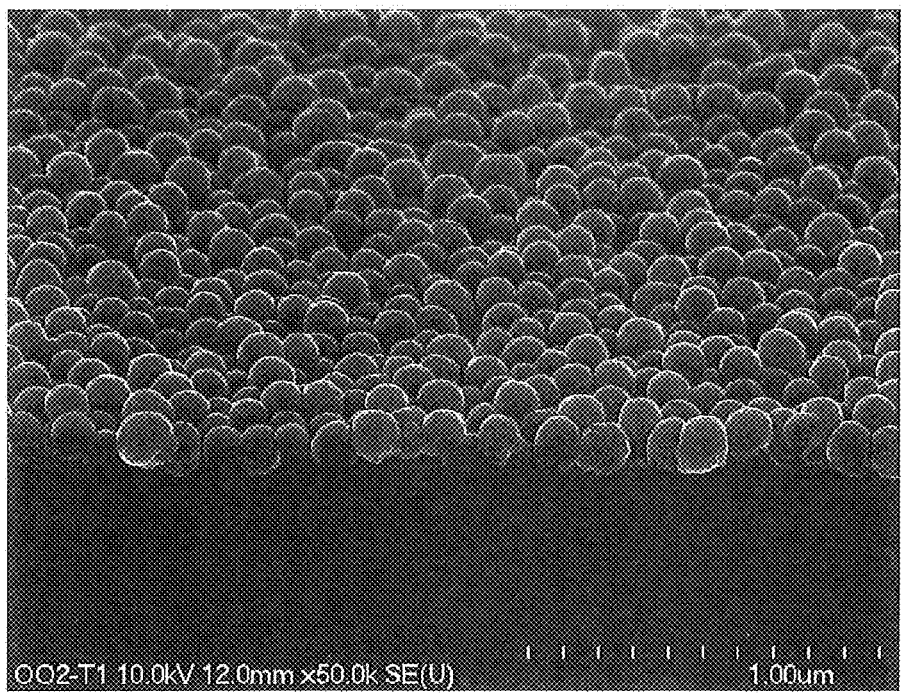
FIG. 3 shows a result of FE-SEM observation of a peak portion of surface asperities of a cover glass according to Comparative Example 1.
Figure 4:
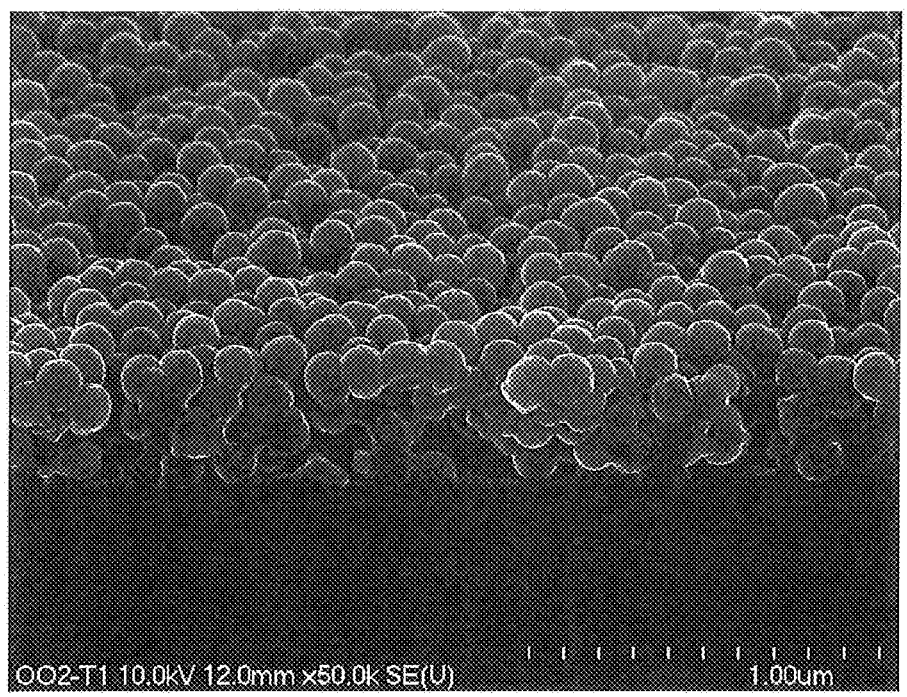
FIG. 4 shows a result of FE-SEM observation of a valley portion of the surface asperities of the cover glass according to Comparative Example 1.
Figure 5:
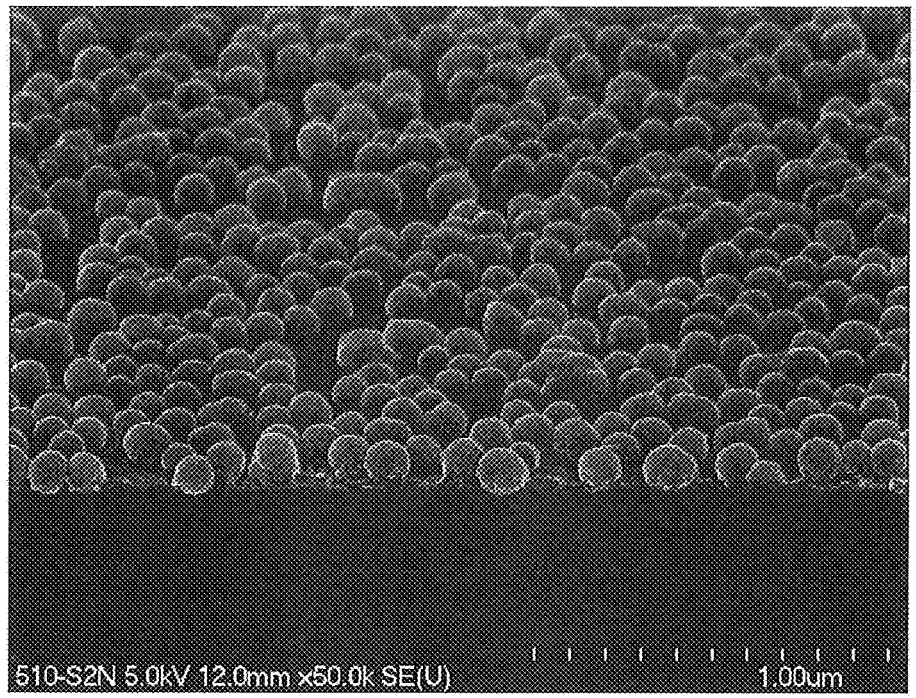
FIG. 5 shows a result of FE-SEM observation of a peak portion of surface asperities of a cover glass according to Comparative Example 2.
Figure 6:
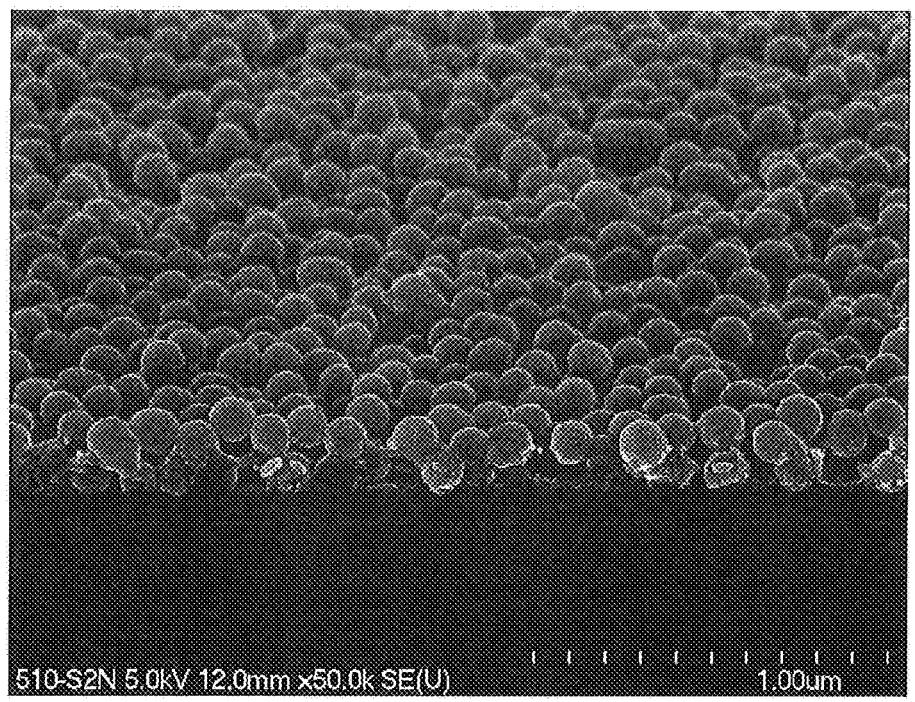
FIG. 6 shows a result of FE-SEM observation of a valley portion of the surface asperities of the cover glass according to Comparative Example 2.

Cover glasses according to Comparative Examples 1 to 8 were obtained in the same manner as in Example 1, except that the proportions of the materials for preparing the raw material liquid and the coating liquid, and the conditions for forming the reflection-reducing film (conditions for drying and conditions for calcining), were as shown in Table 3. The thus-obtained cover glasses according to Comparative Examples 1 to 8 were evaluated for the above-described properties. The results of the evaluation are shown in Table 4. In addition, results of FE-SEM observation of cross-sections of the reflection-reducing film of the cover glass according to Comparative Example 1 are shown in FIG. 3 (peak portion) and FIG. 4 (valley portion). Furthermore, results of FE-SEM observation of cross-sections of the reflection-reducing film of the cover glass according to Comparative Example 2 are shown in FIG. 5 (peak portion) and FIG. 6 (valley portion).

TABLE 1

|  | Example 1 | Example 2 | Example 3 | Example 4 | Example 5 | Example 6 | Example 7 | Example 8 |
|---|---|---|---|---|---|---|---|---|
| Amount of fine silica particles [wt. %] | 85.96 | 85.96 | 85.96 | 85.96 | 85.96 | 85.96 | 84.91 | 85.96 |
| Amount of $SiO_2$ binder [wt. %] | 9.55 | 9.55 | 9.55 | 9.55 | 9.55 | 9.55 | 9.43 | 9.55 |
| Amount of added $ZrO_2$ [wt. %] | 4.49 | 4.49 | 4.49 | 4.49 | 4.49 | 4.49 | 5.66 | 4.49 |
| Solid content concentration in coating liquid [wt. %] | 1.1 | 0.9 | 1.1 | 0.9 | 1.0 | 0.9 | 1.1 | 1.1 |
| Figured glass Sm [μm] | 790 | 790 | 790 | 790 | 790 | 790 | 790 | 790 |
| Figured glass Ra [μm] | 1.1 | 1.1 | 1.1 | 1.1 | 1.1 | 1.1 | 1.1 | 1.1 |
| Average slope angle θ [°] | 0.32 | 0.32 | 0.32 | 0.32 | 0.32 | 0.32 | 0.32 | 0.32 |
| Thickness of reflection-reducing film (at valley portion) [nm] | 185 | 176 | 183 | 182 | 178 | 174 | 192 | 190 |
| Filling fraction of fine silica particles [%] | 49.4 | 44 | 58 | 57 | 47 | 45 | 51 | 44 |
| Appearance evaluation | Excellent | Excellent | Excellent | Excellent | Excellent | Excellent | Excellent | Good |
| Transmittance gain [%] | 2.46 | 2.52 | 2.44 | 2.53 | 2.47 | 2.50 | 2.39 | 2.53 |
| Average transmittance [%] | 1.89 | 1.82 | 1.98 | 1.94 | 1.83 | 1.85 | 1.93 | 1.83 |
| Reflectance loss [%] | 2.60 | 2.68 | 2.51 | 2.55 | 2.66 | 2.64 | 2.54 | 2.66 |
| Salt spray test Transmittance change [%] | 0.13 | 0.09 | 0.04 | 0.12 | — | — | — | — |
| Alkali resistance evaluation Transmittance change [%] | 0.16 | 0.83 | 0.05 | 0.17 | 0.60 | 0.75 | — | 0.4 |

TABLE 2

|  | Example 1 | Example 2 | Example 3 | Example 4 | Example 5 | Example 6 | Example 7 | Example 8 |
|---|---|---|---|---|---|---|---|---|
| Fine silica particle dispersion liquid [parts by weight] | 39.1 | 39.1 | 39.1 | 39.1 | 39.1 | 39.1 | 39.1 | 39.1 |
| Ethyl cellosolve [parts by weight] | 56.4 | 56.4 | 56.4 | 56.4 | 56.4 | 56.4 | 56.4 | 56.4 |
| 1N hydrochloric acid [parts by weight] | 1 | 1 | 1 | 1 | 1 | 1 | 1 | 1 |
| Tetraethoxysilane [parts by weight] | 3.5 | 3.5 | 3.5 | 3.5 | 3.5 | 3.5 | 3.5 | 3.5 |
| Raw material liquid [parts by weight] | 11 | 9 | 11 | 9 | 10 | 9 | 11 | 11 |
| Propylene glycol [parts by weight] | — | — | 10 | 10 | — | — | — | 5 |
| 3-methoxy-1-butanol [parts by weight] | 10 | 10 | — | — | 10 | 10 | 10 | — |
| 2-propanol [parts by weight] | 78.8 | 80.8 | 78.8 | 80.8 | 79.8 | 80.8 | 78.8 | 78.8 |
| $ZrCl_2O \cdot 8H_2O$ (50% aqueous solution) [parts by weight] | 0.34 | 0.28 | 0.34 | 0.28 | 0.31 | 0.28 | 0.44 | 0.34 |
| L7001 (10% aqueous solution) [parts by weight] | 0.02 | 0.02 | — | — | 0.02 | 0.02 | 0.02 | 0.02 |
| CoatOSil 3505 (10% aqueous solution) [parts by weight] | — | — | 0.02 | 0.02 | — | — | — | — |
| Drying temperature [° C.]/ Drying time [seconds] | 400/46 | 400/46 | 400/46 | 400/46 | 350/80 | 350/80 | 370/56 | 370/56 |

TABLE 2-continued

|  | Example 1 | Example 2 | Example 3 | Example 4 | Example 5 | Example 6 | Example 7 | Example 8 |
|---|---|---|---|---|---|---|---|---|
| Calcining temperature [° C.]/ Calcining time [minutes] | 610/8 | 610/8 | 610/8 | 610/8 | 610/8 | 610/8 | 610/8 | 610/8 |

TABLE 3

|  | Comp. Example 1 | Comp. Example 2 | Comp. Example 3 | Comp. Example 4 | Comp. Example 5 | Comp. Example 6 | Comp. Example 7 | Comp. Example 8 |
|---|---|---|---|---|---|---|---|---|
| Fine silica particle dispersion liquid [parts by weight] | 37 | 37 | 39.1 | 39.1 | 39.1 | 39.1 | 39.1 | 39.1 |
| Ethyl cellosolve [parts by weight] | 56.8 | 56.8 | 56.4 | 56.4 | 56.4 | 56.4 | 56.4 | 56.4 |
| 1N hydrochloric acid [parts by weight] | 1 | 1 | 1 | 1 | 1 | 1 | 1 | 1 |
| Tetraethoxysilane [parts by weight] | 5.2 | 5.2 | 3.5 | 3.5 | 3.5 | 3.5 | 3.5 | 3.5 |
| Raw material liquid [parts by weight] | 13 | 11 | 13 | 11 | 11 | 11 | 11 | 11 |
| 3-methoxy-1-butanol [parts by weight] | 10 | 10 | 10 | 10 | 10 | 10 | 10 | 10 |
| 2-propanol [parts by weight] | 76.8 | 78.8 | 76.8 | 78.8 | 78.8 | 78.8 | 78.8 | 79 |
| $ZrCl_2O \cdot 8H_2O$ (50% aqueous solution) [parts by weight] | 0.41 | 0.34 | 0.41 | 0 | 0.18 | 0.55 | 0.73 | 0.34 |
| L7001 (10% aqueous solution) [parts by weight] | 0.02 | 0.02 | 0.02 | 0.02 | 0.02 | 0.02 | 0.02 | 0 |
| Drying temperature [° C.]/ Drying time [seconds] | 400/46 | 400/46 | 400/46 | 350/80 | 370/56 | 350/80 | 370/56 | 370/56 |
| Calcining temperature [° C.]/ Calcining time [minutes] | 610/8 | 610/8 | 610/8 | 610/8 | 610/8 | 610/8 | 610/8 | 610/8 |

TABLE 4

|  | Comp. Example 1 | Comp. Example 2 | Comp. Example 3 | Comp. Example 4 | Comp. Example 5 | Comp. Example 6 | Comp. Example 7 | Comp. Example 8 |
|---|---|---|---|---|---|---|---|---|
| Amount of fine silica particles [wt. %] | 81.18 | 81.18 | 85.96 | 90 | 87.80 | 83.72 | 81.82 | 85.96 |
| Amount of $SiO_2$ binder [wt. %] | 14.33 | 14.33 | 9.55 | 10 | 9.76 | 9.30 | 9.09 | 9.55 |
| Amount of added $ZrO_2$ [wt. %] | 4.49 | 4.49 | 4.49 | 0 | 2.44 | 6.98 | 9.09 | 4.49 |
| Solid content concentration in coating liquid [wt. %] | 1.3 | 1.1 | 1.3 | 1.1 | 1.1 | 1.1 | 1.1 | 1.1 |
| Figured glass Sm [μm] | 790 | 790 | 790 | 790 | 790 | 790 | 790 | 790 |
| Figured glass Ra [μm] | 1.1 | 1.1 | 1.1 | 1.1 | 1.1 | 1.1 | 1.1 | 1.1 |
| Average slope angle θ [°] | 0.32 | 0.32 | 0.32 | 0.32 | 0.32 | 0.32 | 0.32 | 0.32 |
| Thickness of reflection-reducing film (at valley portion) [nm] | 360 | 170 | 230 |  |  |  |  | 120 |
| Density of fine silica particles (Filling fraction) | 67.2 | 29.9 | 68 |  |  |  |  | 74 |
| Appearance evaluation | Excellent | Good | Good | Good | Good | Good | Good | Poor |
| Transmittance gain [%] | 2.05 | 2.35 | 2.23 | 2.32 | 2.30 | 2.16 | 2.04 | 2.32 |
| Average transmittance [%] | 2.39 | 2.03 | 1.91 | 2.03 | 1.95 | 2.14 | 2.17 | 2.06 |
| Reflectance loss [%] | 2.10 | 2.46 | 2.55 | 2.44 | 2.52 | 2.34 | 2.31 | 2.50 |
| Salt spray test Transmittance change [%] | 0.15 | — | — | — | — | — | — | — |
| Alkali resistance evaluation Transmittance change [%] | 0.10 | — | 0.61 | — | — | — | — | — |

As shown in FIG. 1, the fine silica particles were uniformly arranged on the peak portions of the surface asperities of the glass sheet of Example 1. The filling fraction of the fine silica particles on the peak portions of the surface asperities in Example 1 was 49.4% as shown in Table 1. As shown in FIG. 3, the fine silica particles were arranged more densely on the peak portions of the surface asperities of the glass sheet of Comparative Example 1 than on those in Example 1. As shown in Table 4, the filling fraction in Comparative Example 1 was 67.2%. As shown in FIG. 5, the fine silica particles were arranged less densely on the peak portions of the surface asperities of the glass sheet of Comparative Example 2 than on those in Example 1. As shown in Table 4, the filling fraction in Comparative Example 2 was 29.9%. In the peak portions of the surface asperities, as shown in FIG. 5, there were observed some regions in which the distance between the fine silica particles was larger than the distance between the fine silica particles in the other regions. In other words, the fine silica particles were not uniformly arranged on the peak portions of the surface asperities of the glass sheet of Comparative Example 2. As shown in Table 1 and Table 4, the transmittance gain in Example 1 was 2.46, while the transmittance gain in Comparative Example 1 was 2.05, and the transmittance gain in Comparative Example 2 was 2.35. This suggested that a cover glass in which the filling fraction of the fine silica particles on the peak portions of the surface asperities of the glass sheet is in the range of 35 to 65% exhibits a high transmittance gain of 2.40% or more.

As shown in Table 4, the thickness of the reflection-reducing film of Comparative Example 1 at the valley portions of the surface asperities was 3.6 times the average particle diameter of the fine silica particles which was 100 nm, and the thickness of the reflection-reducing film of Comparative Example 3 at the valley portions of the surface asperities was 2.3 times the average particle diameter of the fine silica particles. In addition, the thickness of the reflection-reducing film of Comparative Example 8 at the valley portions of the surface asperities was 1.2 times the average particle diameter of the fine silica particles. By contrast, the thicknesses of the reflection-reducing films of Examples 1 to 8 at the valley portions of the surface asperities were in the range of 1.5 to 2.1 times the average particle diameter of the fine silica particles which was 100 nm. The transmittance gains according to Comparative Example 1 and Comparative Example 8 were lower than, for example, the transmittance gains according to Examples 1 to 8. This suggested that it is preferable that, in the valley portions of the surface asperities, the fine silica particles should be stacked to a height corresponding to 1.5 to 2.1 times the average particle diameter of the fine silica particles in order to increase the transmittance gain.

As shown in Table 1 and Table 2, $ZrO_2$ was not contained in Comparative Example 4. The amount of added $ZrO_2$ in Comparative Example 5 was 2.44 weight %, and was less than the amounts of added $ZrO_2$ in Examples 1 to 8. The transmittance gains in Comparative Example 4 and Comparative Example 5 were less than the transmittance gains in Examples 1 to 8. This suggested that it is preferable that the amount of $ZrO_2$ contained in the reflection-reducing film of the cover glass should be 3 weight % or more in order for the cover glass to exhibit a high transmittance gain. However, the transmittance gains in Comparative Example 6 and Comparative Example 7 were less than the transmittance gains in Examples 1 to 8 despite the fact that $ZrO_2$ was added in larger amounts in Comparative Example 6 and Comparative Example 7 than in Examples 1 to 8. This suggested that it is preferable that the amount of $ZrO_2$ contained in the reflection-reducing film of the cover glass should be 6 weight % or less in order for the cover glass to exhibit a high transmittance gain. Thus, it was suggested that the amount of $ZrO_2$ contained in the reflection-reducing film is preferably 3 to 6 weight %, more preferably 4 to 6 weight %, and particularly preferably 4.3 to 6.0 weight % in order for the cover glass to exhibit a high transmittance gain.

As shown in Table 3, no surfactant was added in Comparative Example 8. In Comparative Example 8, as shown in Table 4, the result of the appearance evaluation was "Poor", and the transmittance gain was low. This suggested that it is preferable to add a surfactant in the preparation of the coating liquid.

In Examples 1 to 8, the ratio by weight of the fine silica particles to the binder was 90:10. By contrast, in Comparative Example 1 and Comparative Example 2, the ratio by weight of the fine silica particles to the binder was 85:15. The transmittance gains in Comparative Example 1 and Comparative Example 2 were less than the transmittance gains in Examples 1 and 8. Therefore, it was suggested that the ratio by weight of the fine silica particles to the binder in the reflection-reducing film is preferably 88:12 to 93:7, more preferably 89:11 to 92:8, and even more preferably 89:11 to 91:9 in order for the cover glass to exhibit a high transmittance gain.

As shown in Table 1, the results of the salt spray test were that the absolute values of the transmittance change of the cover glasses of Examples 1 to 4 were not more than 1%; namely, the cover glasses of Examples 1 to 4 exhibited practically sufficient resistance to salt water.

As shown in Table 1, the results of the alkali resistance evaluation were that the absolute values of the transmittance change of the cover glasses of Examples 1 to 6 and Example 8 were not more than 1%; namely, the cover glasses of Examples 1 to 6 and Example 8 exhibited practically sufficient alkali resistance.

As shown in Table 1, the average reflectances of the cover glasses according to Examples 1 to 8 were less than 2.0%. In addition, the reflectance losses of the cover glasses according to Examples 1 to 8 were more than 2.50%.

As shown in Table 1, the results of the appearance evaluation were that, in Examples 1 to 8, the evenness of reflected light was good, and practically sufficient appearance properties were exhibited.

INDUSTRIAL APPLICABILITY

According to the present invention, a cover glass for photoelectric conversion devices that exhibits a high transmittance gain can be provided.

The invention claimed is:
1. A cover glass for photoelectric conversion devices, comprising:
    a glass sheet having surface asperities; and
    a reflection-reducing film formed over the surface asperities of the glass sheet, wherein
    the surface asperities of the glass sheet have an average spacing Sm of 0.3 mm or more and 2.5 mm or less and an arithmetic average roughness Ra of 0.3 µm to 5 µm,
    the reflection-reducing film includes fine silica particles having an average particle diameter of 50 to 200 nm and a $SiO_2$ binder for the fine silica particles,
    the fine silica particles are uniformly arranged in an in-plane direction of the reflection-reducing film on peak portions of the surface asperities,
    the fine silica particles are arranged in a single layer in a direction of the thickness of the reflection-reducing film on peak portions of the surface asperities,
    the fine silica particles are stacked to a height corresponding to 1.5 to 2.1 times the average particle diameter of the fine silica particles in valley portions of the surface asperities,
    a filling fraction F of the fine silica particles arranged in the in-plane direction of the reflection-reducing film on peak portions of the surface asperities is 35 to 65%,
    a transmittance gain is 2.37% or more, the transmittance gain being obtained by subtracting an average transmittance of the glass sheet as measured when light having wavelengths ranging from 380 to 1100 nm are incident on a face of the glass sheet that has the surface asperities, from an average transmittance of the cover glass as measured when light having the wavelengths are incident on a reflection-reducing film side of the cover glass, and the filling fraction F is defined by the following formula:

$F = AB \times 100$, where

A represents the number of the fine silica particles contained in a square region each of whose sides has a length that is 10 times the average particle diameter of the fine silica particles, and B represents the number of spheres filled in the square region when the spheres are assumed to have a diameter equal to the average particle diameter of the fine silica particles and to be arranged in closest packing in the square region.

2. The cover glass for photoelectric conversion devices according to claim 1, wherein the surface asperities of the glass sheet have an arithmetic average roughness Ra of 0.5 μm to 1.0 μm.

3. The cover glass for photoelectric conversion devices according to claim 1, wherein the surface asperities of the glass sheet have an average slope angle θ of 0.05 to 1.0 degrees.

4. The cover glass for photoelectric conversion devices according to claim 1, wherein a ratio by weight of the fine silica particles to the $SiO_2$ binder is 88:12 to 93:7.

5. The cover glass for photoelectric conversion devices according to claim 1, wherein the reflection-reducing film contains 3 to 6 mass % of zirconium oxide.

6. The cover glass for photoelectric conversion devices according to claim 2, wherein the surface asperities of the glass sheet have an average slope angle θ of 0.05 to 1.0 degrees.

\* \* \* \* \*